(12) United States Patent
Schmitt et al.

(10) Patent No.: US 8,378,678 B2
(45) Date of Patent: Feb. 19, 2013

(54) SYSTEM FOR ORDERING ACQUISITION OF FREQUENCY DOMAIN COMPONENTS REPRESENTING MR IMAGE DATA

(75) Inventors: Peter Schmitt, Weisendorf (DE); Gerhard Laub, Burlingame, CA (US); Yutaka Natsuaki, Los Angeles, CA (US); Randall Kroeker, Winnipeg (CA)

(73) Assignee: Siemens Medical Solutions USA, Inc., Malvern, PA (US)

( * ) Notice: Subject to any disclaimer, the term of this patent is extended or adjusted under 35 U.S.C. 154(b) by 490 days.

(21) Appl. No.: 12/692,949

(22) Filed: Jan. 25, 2010

(65) Prior Publication Data

US 2010/0205143 A1 Aug. 12, 2010

Related U.S. Application Data

(60) Provisional application No. 61/151,895, filed on Feb. 12, 2009.

(51) Int. Cl.
*G01V 3/00* (2006.01)
(52) U.S. Cl. ...................................................... 324/307
(58) Field of Classification Search ........... 324/300–322
See application file for complete search history.

(56) References Cited

U.S. PATENT DOCUMENTS

| | | | |
|---|---|---|---|
| 7,003,343 B2 | 2/2006 | Watts et al. | |
| 7,279,892 B2 * | 10/2007 | Speier et al. | 324/307 |
| 2005/0203377 A1 | 9/2005 | Watts et al. | |
| 2008/0116892 A1 | 5/2008 | Laub et al. | |
| 2009/0212773 A1 | 8/2009 | Feinberg | |

OTHER PUBLICATIONS

SIEMENS Applications Document, Turbo-MRA, Magnetom Vision, Numaris 3 B31A/C, Feb. 1998.
Maki et al., "The Effects of Time Varying Intravascular Signal Intensity and K-Space Acquisition order on Three-Dimensional MR Angiography Image Quality", JMRI, 1996, vol. 6, pp. 642-651.
Willinek et al., "Randomly Segmented Central k-Space Ordering High-Spatial-Resolution Contrast-enhanced MR Angiography of the Supraaortic Arteries: Initial Experience", Radiology, 2002, 225, pp. 583-588. RSNA.
Wilman et al., "Improved Centric Phase Encoding Orders for Three-Dimensional Magnetization-Prepared MR Angiography", MRM, 1996, vol. 36, pp. 384-392, Williams & Wilkins.
Wilman et al., "Performance of an Elliptical Centric View Order for Signal Enhancement and Motion Artifact Suppression in Breath-hold Three-Dimensional Gradient Echo Imaging", MRM, 1997, vol. 38, pp. 793-802.

* cited by examiner

*Primary Examiner* — Dixomara Vargas
(74) *Attorney, Agent, or Firm* — Alexander J Burke

(57) ABSTRACT

A system orders acquisition of frequency domain components representing MR image data for storage in a storage array (e.g., k-space). A storage array of individual data elements stores corresponding individual frequency components comprising an MR dataset. The array of individual data elements has a designated center and individual data elements individually have a radius to the designated center. A magnetic field generator generates a magnetic field for use in acquiring multiple individual frequency components corresponding to individual data elements in the storage array. The individual frequency components are successively acquired in an order in which radius of respective corresponding individual data elements increases and decreases as the multiple individual frequency components are sequentially acquired during acquisition of an MR dataset representing an MR image. A storage processor stores individual frequency components acquired using the magnetic field in corresponding individual data elements in the array.

18 Claims, 8 Drawing Sheets

10

FIGURE 2a
PRIOR ART
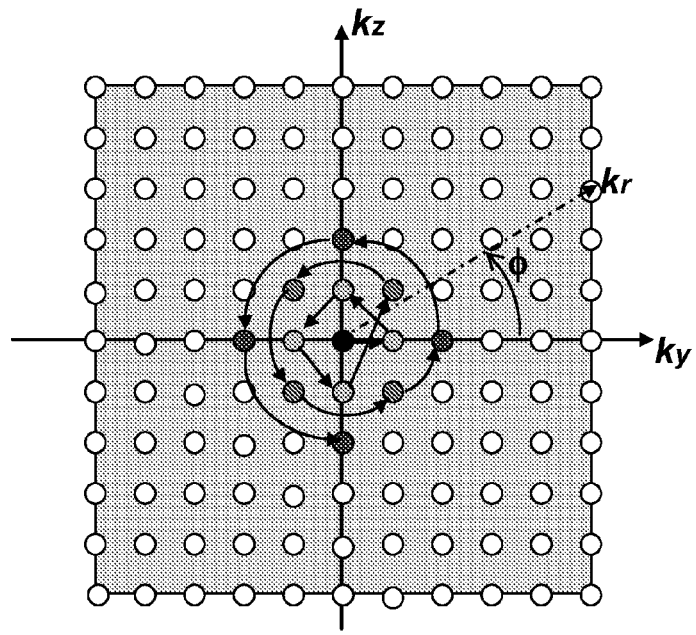
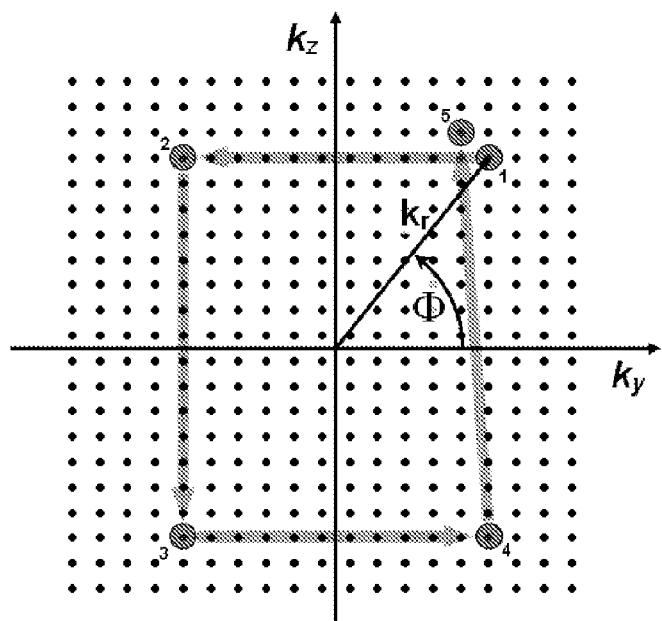
PRIOR ART
FIGURE 2b

FIGURE 3a
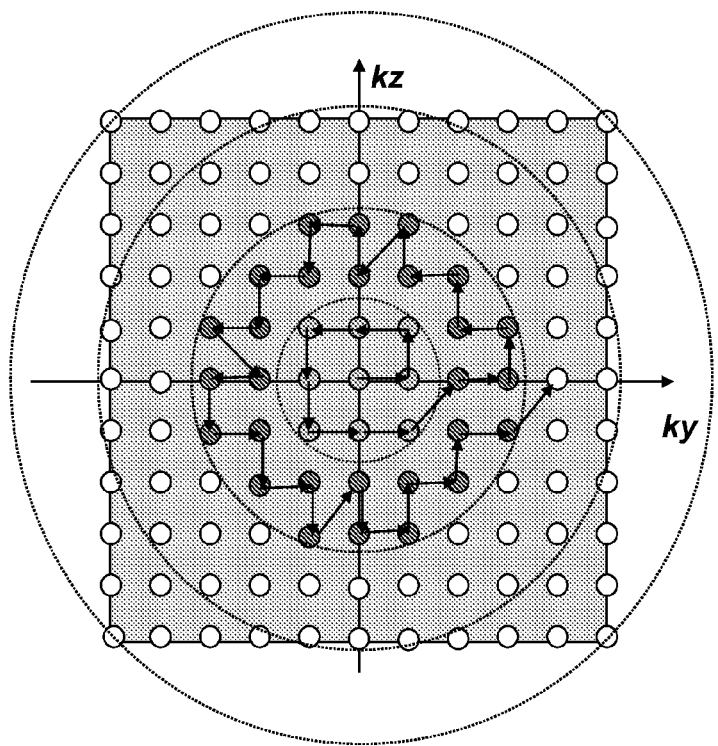
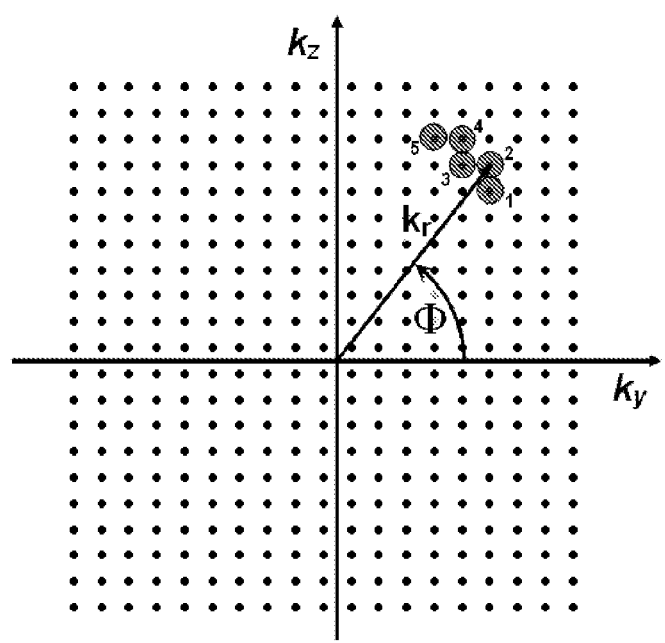
FIGURE 3b

SYSTEM FOR ORDERING ACQUISITION OF FREQUENCY DOMAIN COMPONENTS REPRESENTING MR IMAGE DATA

This is a non-provisional application of provisional application Ser. No. 61/151,895 filed Feb. 12, 2009, by P. Schmitt et al.

FIELD OF THE INVENTION

This invention concerns a system for ordering acquisition of frequency domain components representing MR image data for storage in a storage array (e.g., k-space), by successively acquiring frequency components in an order in which radius of respective corresponding individual data elements in the array increases and decreases, for example.

BACKGROUND OF THE INVENTION

Known MR imaging systems employ a 3D FLASH (fast low angle shot) based contrast-enhanced MR angiography (CEMRA) sequence that utilizes a centric phase encoded k-space element reordering scheme (referred to herein as known centric reordering). K-space is the temporary image space in which data from digitized MR signals is stored during data acquisition and comprises raw data in a spatial frequency domain before reconstruction. When k-space is full (at the end of an MR scan), the data is mathematically processed to produce a final image. FIG. 2a shows $k_y$-$k_z$ points sorted with respect to their radial distance from a k-space origin ($k_r$) and shows ky-kz trajectories after the first 3 increments of radius $k_r$ provided using the known centric phase encoded k-space element reordering Due to the symmetry in k-space there are at least 4 k-space points with the same radial distance which are sorted according to the azimuthal angle $\Phi$ relative to the $k_y$ axis. The centric ordering starts at $k_r$=0, and continues to use k-space points with linearly increasing radial distance (FIG. 2a). Due to the strictly radial sorting, jumps between 4 quadrants occur regularly. FIG. 2b, shows 5 consecutive points selected by known centric reordering and the k-space jumps are larger towards the periphery of k-space. These jumps cause unpleasant acoustic noises and disturb some patients. A system according to invention principles addresses these deficiencies and associated problems.

SUMMARY OF THE INVENTION

A spiral centric reordering system employs an MRI phase reordering process for contrast-enhanced MR angiography (CEMRA), and may be applied in single-phase MRA and dynamic MRA techniques such as time-resolved imaging with stochastic trajectories (TWIST) to reduce total $k_y$-$k_z$ reordering distance reducing emphasis on radius in sorting and by making sure that subsequent k-space points in a $k_y$-$k_z$ plane are selected as closely as possible. A system orders acquisition of frequency domain components representing MR image data for storage in a storage array (e.g., k-space). A storage array of individual data elements stores corresponding individual frequency components comprising an MR dataset. The array of individual data elements has a designated center and individual data elements individually have a radius to the designated center. A magnetic field generator generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of an MR dataset representing an MR image. A storage processor stores individual frequency components acquired using the magnetic field in corresponding individual data elements in the array.

BRIEF DESCRIPTION OF THE DRAWING

FIG. 2a shows known centric phase encoded k-space element reordering and FIG. 2b shows 5 consecutive points selected by the known reordering arrangement.

FIG. 3a shows spiral centric phase encoded k-space element reordering and FIG. 3b shows 5 consecutive points selected by the spiral centric reordering arrangement, according to invention principles.

DETAILED DESCRIPTION OF THE INVENTION

A system advantageously orders acquisition of frequency domain components representing MR image data in a spiral centric manner for storage in a storage array (e.g., k-space) that puts less weight on the radial distance, and in one embodiment ensures that successively acquired k-space points are closely distributed by filling in concentric ring regions. A spiral centric reordering system employs an MRI phase reordering process for contrast-enhanced MR angiography (CEMRA), and may be applied in single-phase MRA and dynamic MRA techniques such as TWIST. The system reduces a total $k_y$-$k_z$ reordering distance by sorting and by making sure that subsequent k-space points in $k_y$-$k_z$ plane are selected as being substantially adjacent.

FIG. 3a shows the concentric rings and ky-kz trajectories of spiral centric phase encoded k-space element reordering. Specifically, FIG. 3a shows a trajectory after the first 2 iterations (corresponding to the inner 2 concentric rings) of the spiral centric ring region. The path of k-space element acquisition follows a spiral-like trajectory starting at $k_r$=0 as shown in FIG. 3b. This substantially eliminates the quadrant jumps except for the corners in k-space as illustrated in FIG. 3b which shows 5 consecutive points selected by the spiral centric reordering arrangement. The loud acoustic noise of known MR imaging scanners is now replaced by a more pleasant reduced oscillatory wave sound. The system advantageously provides significantly shorter total reordering distance to mitigate phase coherence artifacts when contrast-enhanced MR angiography (CEMRA) images are acquired without phase encoded rewinders in favor of saving scan time (i.e. ultra-short TR (repetition time), up to 20% scan time reduction). Phase encoded rewinder gradients are used to bring the trajectory back to the k-space origin.

Figure 1:
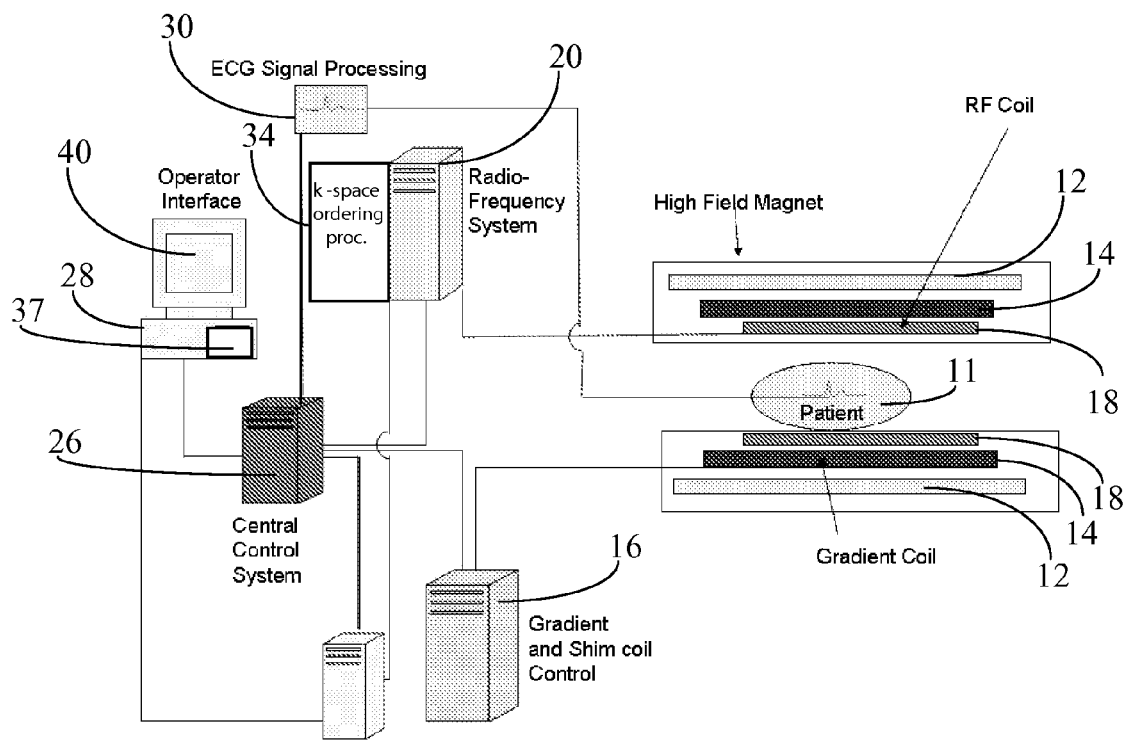
FIG. 1 shows a system for ordering acquisition of frequency domain components representing MR image data for storage in an array, according to invention principles.

FIG. 1 shows system 10 for ordering acquisition of frequency domain components representing MR image data for storage in a k-space storage array. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements individually have a radius to the designated center;

A magnetic field generator (comprising magnetic coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 4:
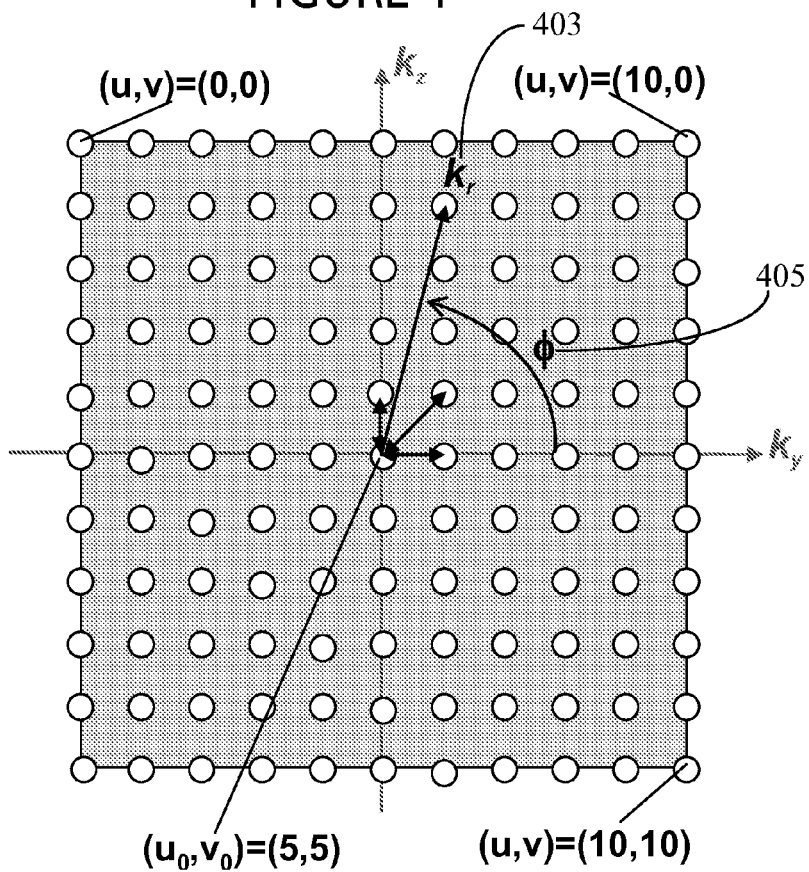
FIG. 4 illustrates Cartesian and Polar coordinate notations used in the $k_y$-$k_z$ plane, according to invention principles.

FIG. 4 illustrates Cartesian and Polar coordinate notations used in a k-space data element array $k_y$-$k_z$ plane. Specifically, FIG. 4 shows radius ($k_r$) 403 and azimuthal angle about $k_y$ axis ($\phi$) of Cartesian $k_y$-$k_z$ points representing k-space data elements. The rectilinear indices (u,v) of k-space data points in $k_y$ and $k_z$ directions start at (0,0) in the upper left hand corner, and ($u_0$,$v_0$) are the indices (u,v) at the origin of the $k_y$-$k_z$ plane. The i-th Cartesian coordinate [$k_y$(i),$k_z$(i)] (in $mm^{-1}$) is, $$[k_y(i), k_z(i)] = [(u(i)-u_0)*dk_y, (v(i)-v_0)*dk_z],$$

where $$[dk_y, dk_z] = \text{smallest increment in } k_y\text{-}k_z \text{ plane}$$
$$= [1/FOV_y, 1/FOV_z].$$

For the i-th Cartesian coordinate point [$k_y$(i),$k_z$(i)], the radius ($k_r$(i)) is $$k_r(i)=\sqrt{k_y(i)^2+k_z(i)^2},$$

and the smallest increment in radius $k_r$ is $$dk_r=\sqrt{dk_y^2+dk_z^2}.$$

The azimuthal angle about $k_y$ axis ($\phi$(i)) is
 $\phi$(i)=arctan($k_z$(i)/$k_y$(i)), [0<=$\phi$(i)<2$\pi$].
 if $k_y$(i)=0 and $k_z$(i)=0, then $\phi$(i)=0.
 if $k_y$(i)=0 and $k_z$(i)>0, then $\phi$(i)=$\pi$/2.
 if $k_y$(i)=0 and $k_z$(i)<0, then $\phi$(i)=3$\pi$/2.

Figure 5:
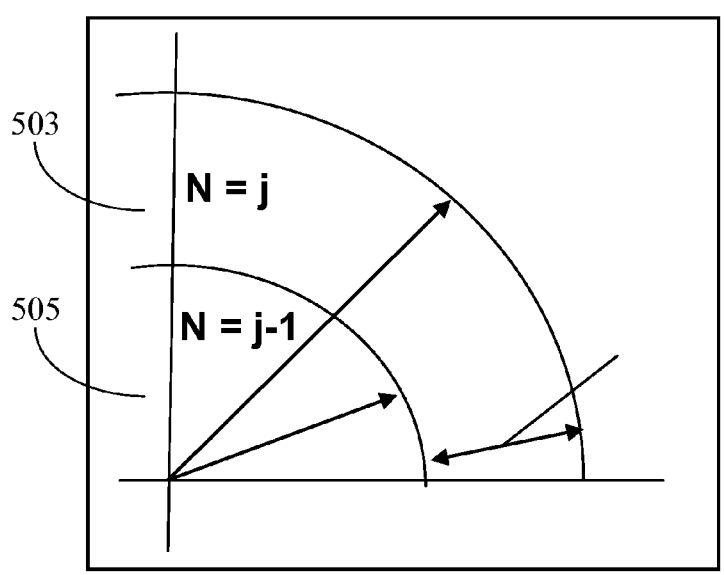
FIG. 5 illustrates analysis of a concentric ring portion, according to invention principles.

FIG. 5 illustrates analysis of a concentric ring portion. In addition to radius and azimuthal angle, k-space component processor unit 34 performs spiral centric reordering calculation using equidistant concentric ring region number (N) as part of a sorting calculation. The concentric ring region number N is determined as follows.

Let j be an index of the ring region that increments in radial direction. For the j-th ring region, the outer radius $k_{r,out}$(j) is $$k_{r,out}(j)=k_{r,in}(j)+\Delta k_r=k_{r,out}(j-1)+\Delta k_r,$$

where $k_{r,in}$ is inner radius (which is the outer radius of the previous ring region (j−1) 505) and $\Delta k_r$ is the ring width. The ring width $\Delta k_r$ is calculated based on $dk_r$:

$$\Delta k_r=W_{width}dk_r,$$

where $W_{width}$ is a weight factor for adjusting the ring width. In one embodiment $W_{width}$ is set at 2, and this ensures at least 2 data points along $k_y$ and $k_z$ axes are acquired in each ring region. The concentric ring region number (N) for any given radius $k_r$ is determined as $$N(k_r)=\text{floor}[k_r/\Delta k_r],$$

and an operator floor[x] is a "floor" function that rounds down x to the nearest integer.

K-space component processor unit 34 performs spiral centric reordering calculation using order metric equation $M(k_r, \phi)$ with 3 components as previously determined (i.e. radius $k_r$ ($0 \leq k_r \leq k_{r,max}$), azimuthal angle $\phi$ ($0 \leq \phi < 2\pi$), and the ring region number N ($0 \leq N \leq N_{max}$)) are calculated for individual $k_y$-$k_z$ k-space data elements and an MR scan is performed in accordance with the value of M in ascending order. The order metric equation M is, $$M(k_r,\phi)=k_r/k_{r,max}*W_r+\phi/\phi_{max}*W_\phi+N/N_{max}*W_N.$$

Individual components in the metric equation $M(k_r, \phi)$ are normalized to range [0,1] by dividing with a maximum value (denoted by the subscript max), and individual components have a corresponding weight factor W to give preferential weighting. The weight factors determine different reordering arrangements. Known centric reordering is implemented with $W_r \gg W_\phi$ and $W_N=0$. In contrast, for spiral centric reordering performed by unit 34, weight factors are $W_N \gg W_\phi \gg W_r > 0$ and $W_{width} > 0$. In one embodiment of the spiral centric reordering the weight factors are set to the following: $W_r=10^{-6}$, $W_\phi=1$, $W_N=10^6$, and $W_{width}=2$, for example. Weight factors for different components are separated by $10^6$ to reduce potential mutual interference.

The static-like acoustic noise generated by known centric reordering is due to the quadrant jumps that require magnetic gradients to change rapidly as radius increases. System 10 employs K-space component processor unit 34 to minimize magnetic gradient transitions using smaller incremental changes and thus reducing acoustic noises. Phase incoherence artifacts are caused by spin phase residuals that Phase Encoding (PE) rewinder gradients (used to bring k-space trajectory back to the k-space origin) normally take care of at the end of scan repetition time TR. Without a PE rewinder gradient, the residuals continue to accumulate over the course of an MR sequence, and the amount of the spin phase residuals are directly proportional to the phase reordering travel distance. Thus by having a minimum phase reordering distance, the phase incoherence artifacts are advantageously significantly attenuated. In one embodiment, the k-space component processor unit 34 performs spiral centric phase reordering based on Cartesian geometry and uses a floor function to divide k-space into concentric regions.

Contrast-enhanced MR angiography (CEMRA) sequences (twist and fl3d_ce (fast low angle shot with contrast enhancement) with timing bolus) advantageously use spiral centric reordering provided by unit 34 for patient comfort and for use in providing an ultra-short TR scan. Additionally, the system facilitates and improves 3D applications that require minimum phase accumulation. A 3D SSFP (Steady-State Free Precession) sequence is also advantageously improved with the system because the associated flow effect is mitigated using minimal phase encoded increments. The spiral centric reordering performed by unit 34 is also used for contrast-enhanced MR Angiography with a care-bolus technique. After contrast injection, a real-time imaging sequence is applied which produces images at a rate of approximately 1 image/sec. In response to a contrast agent arriving in an anatomical region of interest, a user switches to a contrast-enhanced imaging sequence starting at the center of k-space to optimally visualize an arterial enhancement. The sequence uses unit 34 spiral centric reordering to efficiently perform scanning of the center of k-space during an arterial window in which radius of respective corresponding individual data elements increases and decreases as individual frequency components are sequentially acquired. Therefore, in one embodiment unit 34 spiral centric reordering has conspicuous oscillatory behavior throughout a scan. In contrast, the radius of k-space data elements sampled over time in known centric reordering, is monotonically and continuously increasing.

Figure 6:
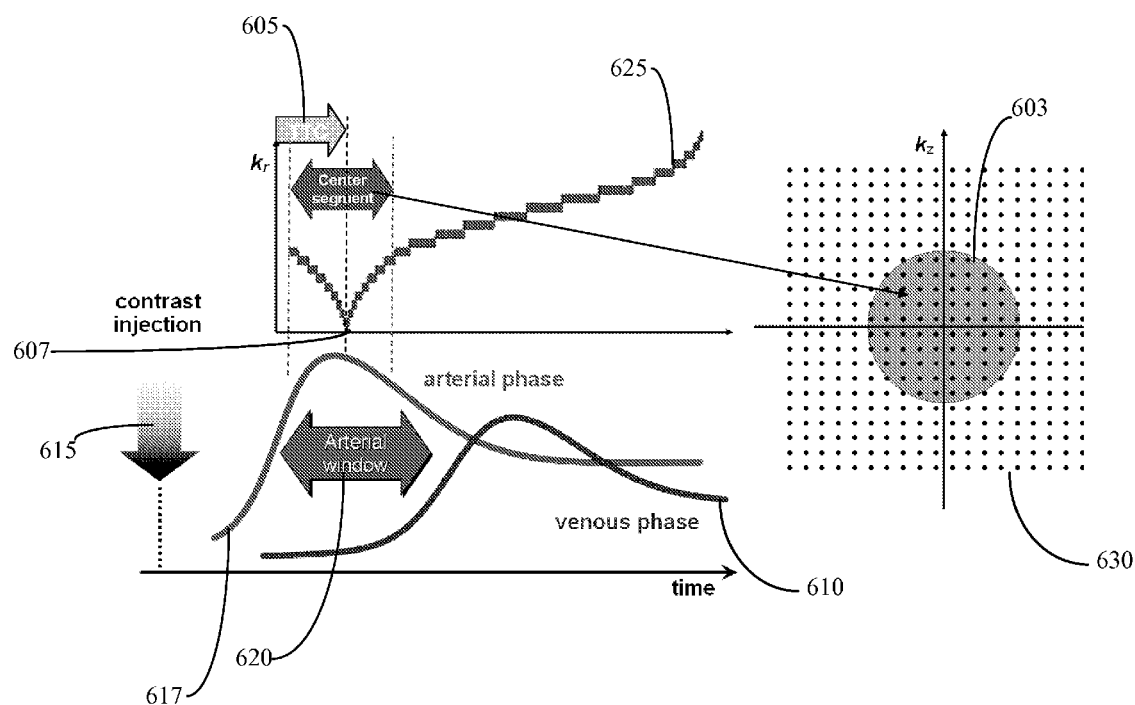
FIG. 6 shows timing of physiological and MR sequence events for a delayed spiral centric CEMRA sequence using a contrast agent test bolus, according to invention principles.

FIG. 6 shows timing of physiological and MR sequence events for a delayed spiral centric CEMRA sequence using a contrast agent test bolus. For contrast-enhanced MR Angiography using a test bolus (e.g. optimized FLASH 3D sequence fl3d_ce), a delayed measurement of the center of k-space is preferable. The order of k-space data elements in spiral centric reordering performed by unit 34 is changed so that a k-space data element at $k_r=0$ is scanned after a user-defined time called time-to-center (TTC) 605. The delayed spiral centric reordering starts a k-space trajectory at the edge of the center segment 603 moving towards $k_r=0$ (607) and moves outwards again to acquire a complete center segment in 2 substantially equal length paths. The trajectory involves acquiring a k-space region outside of center segment 603 to complete the k-space dataset. The unit 34 spiral centric reordering has conspicuous oscillatory behavior throughout a scan in which radius of respective corresponding individual data elements increases and decreases along a substantially spiral path as individual frequency components are sequentially acquired. In contrast, in known centric reordering, the radius of k-space data elements sampled over time, is a monotonically, continuously decreasing function before the center of k-space is reached, and is a monotonically, continually increasing function afterwards.

Physiological timing is illustrated in events including contrast agent injection 615 followed by arterial flow 617 and venous flow 610 over time and corresponding $k_r$-t plot of delayed spiral centric reordering trajectory 625. The $k_y$-$k_z$ plot 630 shows center segment data 603 highlighted. The size of center segment 603 is determined by duration of time-to-center (TTC) 605. The acquisition timing of the center segment is carefully matched with Arterial window 620 for an optimal result.

In a further embodiment, for dynamic contrast-enhanced MR Angiography (e.g., TWIST), the spiral centric reordering table is split into two segments. A first segment is associated with a center region A and a second segment is associated with a peripheral region B. In this embodiment, center region A, which is analogous to center segment 603 shown in FIG. 6, is acquired in 2 equal length paths (i.e. inward to $k_r=0$, and then outward to complete A region). However, unlike the peripheral segment of FIG. 6, which is acquired in a single outward trajectory path, in this embodiment, the peripheral region B is acquired in multiple out-in paths. Specifically, acquisition of peripheral region B data elements starts at the edge of the A region, moves toward the outer edge of k-space $k_y$-$k_z$ data and moves back inward to the edge of the A region. The amount of data in each B path is determined by parameter density B %. By having shared multiple B region paths with more frequently collected center region A, the temporal resolution is advantageously substantially improved.

Figure 7:
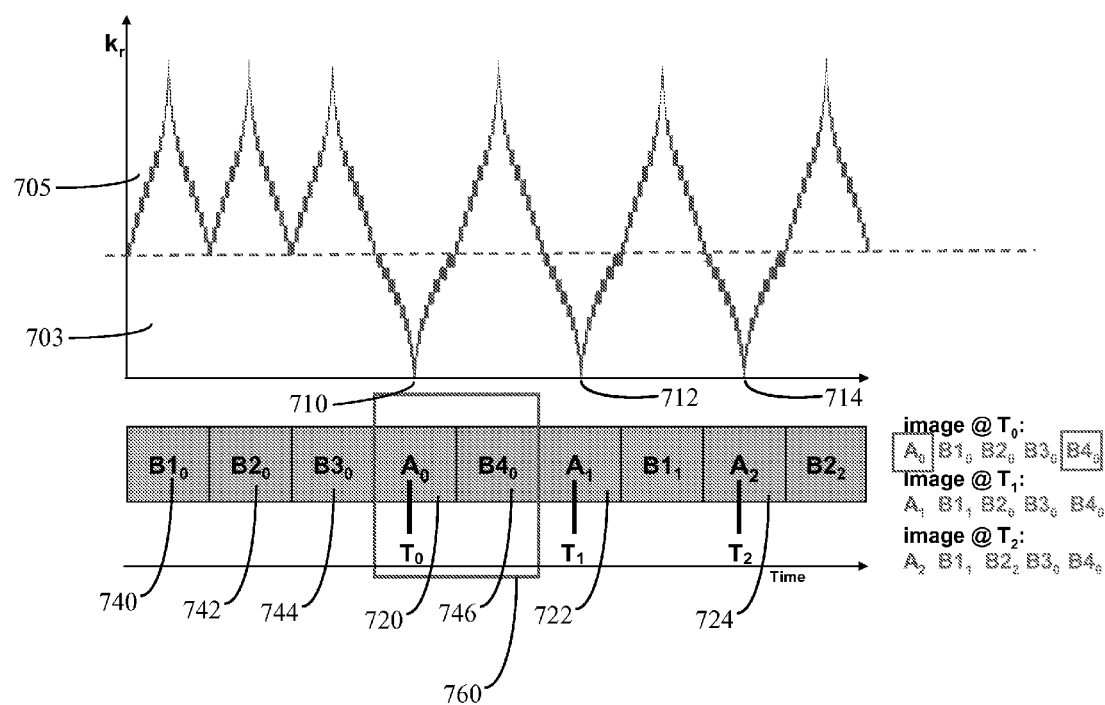
FIG. 7 shows a time-resolved imaging with stochastic trajectories (TWIST) MR image acquisition $k_r$-t plot and A/B region timing, according to invention principles.

FIG. 7 shows a time-resolved imaging with stochastic trajectories (TWIST) MR image acquisition $k_r$-t plot and A/B region timing performed using unit 34 (FIG. 1). Specifically, a k-space centric region, corresponding to region A 703 and region B 705 corresponding to k-space that is peripheral to centric region A, are used in TWIST k-space trajectories. A TWIST k-space trajectory includes first 3 time points ($T_0$, $T_1$, and $T_2$ having zero k-space radius (710, 712 and 714, respectively)) of centric region A having a single path (in time slots 720, 722, 724). The A region size is determined by a percentage parameter comprising relative radius of A and B regions. The peripheral B region is divided into 4 out-in paths B1, B2, B3, and B4 (time slots 740, 742, 744 and 746). The four paths have k-space data element density of 25% of total k-space density.

The advantageous k-space data element trajectory provides relatively high temporal resolution by acquiring 3 B paths (i.e. B$1_0$ B$2_0$ and B$3_0$) prior to repeated pair acquisitions of an A path and a single B path (e.g., $A_0$ and B$4_0$, as highlighted in rectangle 760). Unit 34 updates a just acquired set of k-space data elements of an A path B path k-space trajectory pair (e.g., $A_0$ and B$4_0$) by utilizing k-space data elements of previously acquired 3 B paths to complete a full data set. The duration of an A and B path trajectory pair determines a temporal resolution. Multiple other schemes are possible for sharing peripheral B region data, such as using B region data for reconstruction of a specific $A_N$ path. For this purpose, peripheral B region data is sampled after acquisition of $A_N$, using B region data that is closest in time to $A_N$ path k-space data elements and single k-space data elements are interpolated from data of more than one B region.

In a TWIST embodiment, unit 34 orders acquisition of k-space data elements (frequency components) based on a concentric ring number and azimuth angle. Unit 34 starts acquisition at a non-zero radius ring and initiates acquisition of substantially less than all elements of this ring (i.e. a portion). Unit 34 proceeds with acquisition of k-space data elements having a decreasing ring number and after reaching a zero radius, acquires k-space data elements in a reverse order.

In a further TWIST embodiment, unit 34 alternatively performs first and second acquisition functions. The first acquisition function comprises initiating acquisition of k-space data elements of ring n of N rings, by sampling a portion of it (such as one half), acquiring k-space data elements of a next ring with smaller radius (say n−1) continuing acquisition of concentric rings of k-space data elements until a k-space radius of zero is reached and thereafter acquiring k-space data elements in concentric rings of increasing k-space radius. The second acquisition function comprises acquiring k-space data elements of ring n+1 with a lower density than ring n (smaller portion than one half), acquiring k-space data elements of a next ring with larger radius until a k-space ring of largest radius N is reached and acquiring k-space data elements in concentric rings of reducing k-space radius until ring n+1 is reached. Unit 34 acquires substantially all points that have to be acquired within rings 1 . . . n in a single pass through region A, but substantially less than all points (typically a fraction of <=50%) are acquired in a single pass though region B.

In further embodiments the system orders acquisition of frequency domain components representing MR image data for storage in an array (e.g., k-space). The system includes a storage array of individual data elements for storing corresponding individual frequency components representing an MR dataset of an anatomical region of interest, including components of a low spatial frequency, an intermediate spatial frequency and a high spatial frequency. A magnetic field generator generates a magnetic field for use in acquiring multiple individual frequency components in order of the intermediate spatial frequency, the high spatial frequency and the low spatial frequency. The high spatial frequency substantially corresponds to a maximum radius value of the region of interest from a designated center of the array. A storage processor stores individual frequency components acquired using the magnetic field, in corresponding individual data elements in the array.

In a feature of the invention a magnetic field generator generates a magnetic field for use in acquiring multiple individual frequency components in order of the high spatial frequency, the intermediate spatial frequency and the low spatial frequency, the high spatial frequency substantially corresponding to a maximum radius value of the region of interest from a designated center of the array. A storage processor stores individual frequency components acquired using the magnetic field in corresponding individual data elements in the array.

Figure 8:
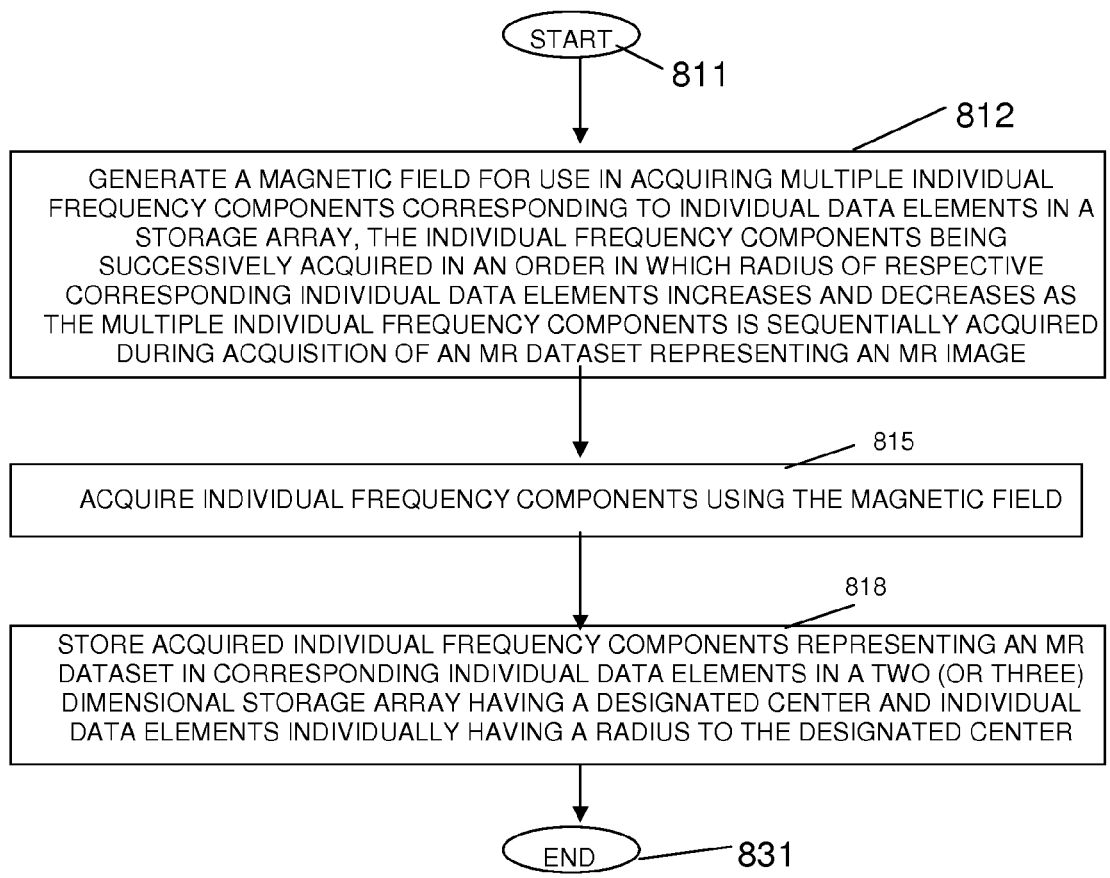
FIG. 8 shows a flowchart of a process performed by a system for ordering acquisition of frequency domain components representing MR image data for storage in an array, according to invention principles.

FIG. 8 shows a flowchart of a process performed by system 10 (FIG. 1) including K-space component processor unit 34 for ordering acquisition of frequency domain components representing MR image data for storage in an array. In step 812 following the start at step 811, a (phase encoding) magnetic field generator in system 10 generates a magnetic field for use in acquiring (and storing) multiple individual frequency components corresponding to individual data elements in a two dimensional storage (k-space) array that may comprise a part of a three dimensional array. An individual frequency component comprises amplitude and phase data stored as a complex number, for example, in a corresponding individual data element in the array. The array of individual data elements has a designated center and individual data elements individually have a radius to the designated center. The individual frequency components are successively acquired (and stored) in an order in which radius of respective corresponding individual data elements increases and decreases along a substantially spiral path as the multiple individual frequency components are sequentially acquired during acquisition of an MR dataset representing an MR image. Specifically, radius of respective corresponding individual data elements alternately increases and decreases as sequential multiple individual frequency components are acquired.

The magnetic field acquires (and stores) individual frequency components in an order corresponding to a sequence of substantially adjacent individual data elements in the array and magnetic field gradient change between successively acquired frequency components is substantially minimized. In one embodiment the order corresponds to a sequence of substantially adjacent individual data elements beginning with an individual data element having a substantially zero radius. The order also corresponds to bands of concentric rings of individual data elements of incremental radius in the array and an individual band encompasses individual data elements of multiple different radii. Further, the magnetic field acquires (and stores) individual frequency components in an individual concentric ring before progressing to a next ring of increased radius. The magnetic field successively acquires individual frequency components in an individual concentric ring corresponding to successive individual data elements of increasing and decreasing radius within an individual ring as the multiple individual frequency components are sequentially acquired. Specifically, the magnetic field acquires individual frequency components in a first central area beginning with an individual data element having a substantially zero radius.

In another embodiment, the magnetic field acquires (and stores) individual frequency components beginning with a component corresponding to an individual data element having a first non-zero radius and in a reverse order until a frequency component corresponding to an individual data element of substantially zero radius is acquired. Specifically, the magnetic field acquires multiple individual frequency components starting with a component corresponding to an individual data element having a first non-zero radius in a reverse order of predominantly reducing radius until a frequency component corresponding to an individual data element of substantially zero radius is acquired. The magnetic field further acquires (and/or stores) individual frequency components in positive order in response to the frequency component corresponding to the individual data element of substantially zero radius being acquired. Specifically, the magnetic field acquires individual frequency components in positive order of predominantly increasing radius in response to the frequency component corresponding to the individual data element of substantially zero radius being acquired.

Further, the storage array comprises an inner region and an outer region and the magnetic field acquires multiple individual frequency components corresponding to individual data elements in the peripheral region in alternately positive and reverse order of predominantly increasing and reducing radius respectively. Also the magnetic field acquires multiple individual frequency components corresponding to individual data elements in the outer (peripheral) region and the inner (centric) region in alternately positive and reverse order of predominantly increasing and reducing radius respectively. In a further embodiment, the magnetic field acquires individual frequency components in an order corresponding to a sequence of substantially adjacent individual data elements of respective increasing and decreasing radius as multiple individual frequency components are sequentially acquired and beginning with an individual data element having a substantially zero radius. Also, the order corresponds to bands of concentric rings of individual data elements of incremental radius in the array.

In step 815 system 10 acquires individual frequency components using the magnetic field. Unit 34 in step 818 stores acquired individual frequency components representing an MR dataset in the corresponding individual data elements in a 2 or 3 dimensional array. The process of FIG. 8 terminates at step 831.

Figure 9:
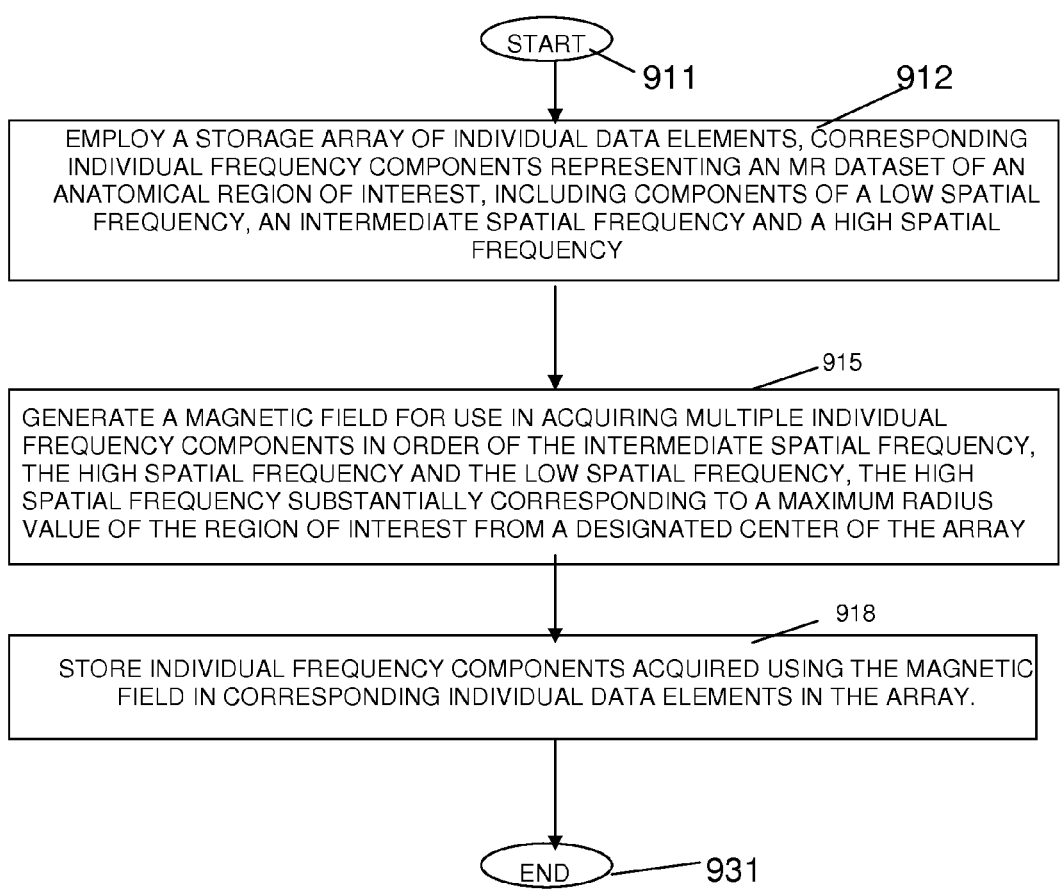
FIG. 9 shows a flowchart of a further process performed by a system for ordering acquisition of frequency domain components representing MR image data for storage in an array, according to invention principles.

FIG. 9 shows a flowchart of a further process performed by system 10 (FIG. 1) including K-space component processor unit 34 for ordering acquisition of frequency domain components representing MR image data for storage in an array comprising an inner region and an outer region. In step 912 following the start at step 911, system 10 uses a storage array of individual data elements in unit 34 for storing corresponding individual frequency components representing an MR dataset of an anatomical region of interest, including components of a low spatial frequency, an intermediate spatial frequency and a high spatial frequency. In step 915 a (phase encoding) magnetic field generator in system 10 generates a magnetic field for use in acquiring (and/or storing) multiple individual frequency components in a particular order. In a first embodiment, the particular order is in order of the intermediate spatial frequency, the high spatial frequency and the low spatial frequency. In particular, the magnetic field acquires individual frequency components in order of the intermediate spatial frequency and the high spatial frequency for multiple different times before acquiring the low spatial frequency component.

In a second embodiment, the particular order is in order of the high spatial frequency, the intermediate spatial frequency and the low spatial frequency. The high spatial frequency substantially corresponds to a maximum radius value of the region of interest from a designated center of the array. The low spatial frequency substantially corresponds to a peak of a contrast agent passing through the region of interest. In particular, the magnetic field acquires individual frequency components in order of the low spatial frequency, intermediate spatial frequency and the high spatial frequency for multiple different times after acquiring the low spatial frequency component. In a further embodiment, the magnetic field acquires individual frequency components in order of the high spatial frequency, intermediate spatial frequency and the low spatial frequency for multiple different times after acquiring the low spatial frequency component. The magnetic field acquires the high spatial frequency and the intermediate spatial frequency components for storage in the outer region and acquires the low spatial frequency component for storage in the inner region.

In a further embodiment the particular order is in order of the intermediate spatial frequency, the low spatial frequency and the high spatial frequency. The high spatial frequency substantially corresponds to a maximum radius value of the region of interest from a designated center of the array. Further, the magnetic field acquires individual frequency components beginning with a component corresponding to an individual data element having a first non-zero radius and in a reverse order until a frequency component corresponding to an individual data element of substantially zero radius is acquired. The individual frequency components are successively acquired in an order in which radius of respective corresponding individual data elements increases and decreases along a substantially spiral path as the multiple individual frequency components is sequentially acquired during acquisition of an MR dataset representing an MR image. The magnetic field acquires individual frequency components in positive order in response to the frequency component corresponding to the individual data element of substantially zero radius being acquired. In step 918, a storage processor in unit 34 stores individual frequency components acquired using the magnetic field in corresponding individual data elements in the array. The process of FIG. 9 terminates at step 931.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps (e.g., of FIGS. 8 and 9) herein may be performed automatically or wholly or partially in response to user command. An activity (including a step) performed automatically is performed in response to executable instruction or device operation without user direct initiation of the activity.

Individual K-space components stored in data elements may be represented by a Fourier transform pair involving position (x,y) and spatial frequency ($k_{FE}$, $k_{PE}$), where $k_{FE}$ and $k_{PE}$ are, $$k_{FE} = \bar{e} G_{FE} m \Delta t$$

and $$k_{PE} = \bar{e} n \Delta G_{PE} T$$

and FE refers to frequency encoding, PE to phase encoding, $\Delta t$ is sampling time (the reciprocal of sampling frequency), T is the duration of $G_{PE}$, $\bar{e}$ is the gyromagnetic ratio, m is the sample number in the FE direction and n is the sample number in the PE direction (also known as partition number), $G_{PE}$ is the phase encoding gradient and $G_{FE}$ is the frequency encoding gradient. The 2D-Fourier Transform of this encoded signal results in a representation of the spin density distribution in two dimensions. K-space has the same number of rows and columns as the final image and during an imaging scan, k-space is filled with raw data one line per TR (Repetition Time).

The system, processes, K-space trajectories and plots of FIGS. 1-9 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system advantageously orders acquisition and storage of frequency domain components representing MR image data in a spiral centric manner by reducing a k-space distance between successively acquired k-space data elements by selecting k-space points (data elements) so successively acquired k-space data elements are substantially adjacent. Further, the processes and applications may, in alternative embodiments, be located on one or more (e.g., distributed) processing devices on a network linking the units of FIG. 1. Any of the functions and steps provided in FIGS. 1-9 may be implemented in hardware, software or a combination of both.

What is claimed is:

1. A system for ordering acquisition of frequency domain components representing MR image data for storage in an array, comprising:
   a storage array of individual data elements for storing corresponding individual frequency components comprising an MR dataset, said array of individual data elements having a designated center and individual data elements individually having a radius to said designated center;
   a magnetic field generator for generating a magnetic field for use in acquiring a plurality of individual frequency components corresponding to individual data elements in said storage array, said individual frequency components being successively acquired in an order in which radius of respective corresponding individual data elements increases and decreases along a substantially spiral path as said plurality of individual frequency components is sequentially acquired during acquisition of an MR dataset representing an MR image; and
   a processor for ordered acquisition of individual frequency components using said magnetic field and for ordered storing acquired individual frequency components in corresponding individual data elements in said array.

2. A system according to claim 1, wherein
   radius of respective corresponding individual data elements alternately increases and decreases as a sequential plurality of said individual frequency components is acquired and
   said storage array is at least one of, (a) a two dimensional array and (b) a three dimensional array.

3. A system according to claim 1, wherein
   said magnetic field acquires individual frequency components in an order corresponding to a sequence of substantially adjacent individual data elements in said array and magnetic field gradient change between successively acquired frequency components is substantially minimized.

4. A system according to claim 3, wherein
   said magnetic field acquires individual frequency components in said order corresponding to a sequence of substantially adjacent individual data elements beginning with an individual data element having a substantially zero radius.

5. A system according to claim 1, wherein
   said magnetic field acquires individual frequency components in an order corresponding to bands of substantially concentric rings of individual data elements of incremental radius in said array and an individual band encompasses individual data elements of a plurality of different radii.

6. A system according to claim 5, wherein
   said magnetic field acquires individual frequency components in an individual concentric ring before progressing to a next ring of increased radius.

7. A system according to claim 6, wherein
   said magnetic field successively acquires individual frequency components in an individual concentric ring corresponding to successive individual data elements of increasing and decreasing radius within an individual ring as said plurality of individual frequency components is sequentially acquired.

8. A system according to claim 6, wherein
said magnetic field acquires individual frequency components in a first central area beginning with an individual data element having a substantially zero radius.
9. A system according to claim 1, wherein
an individual frequency component comprises amplitude and phase data stored as a complex number in a corresponding individual data element in said two dimensional storage array.
10. A system according to claim 1, wherein
said two dimensional storage array of individual data elements for storing corresponding individual frequency components comprises k-space.
11. A system according to claim 1, wherein
said magnetic field acquires individual frequency components beginning with a component corresponding to an individual data element having a first non-zero radius and in a reverse order until a frequency component corresponding to an individual data element of substantially zero radius is acquired.
12. A system according to claim 11, wherein
said magnetic field acquires individual frequency components in positive order in response to said frequency component corresponding to said individual data element of substantially zero radius being acquired.
13. A system according to claim 1, wherein
said magnetic field acquires a plurality of individual frequency components starting with a component corresponding to an individual data element having a first non-zero radius in a reverse order of predominantly reducing radius until a frequency component corresponding to an individual data element of substantially zero radius is acquired and
said magnetic field acquires individual frequency components in positive order of predominantly increasing radius in response to said frequency component corresponding to said individual data element of substantially zero radius being acquired.
14. A system according to claim 1, wherein
said storage array comprises an inner region and an outer region,
said magnetic field acquires a plurality of individual frequency components corresponding to individual data elements in said peripheral region in alternately positive and reverse order of predominantly increasing and reducing radius respectively and
said magnetic field acquires a plurality of individual frequency components corresponding to individual data elements in said outer region and said inner region in alternately positive and reverse order of predominantly increasing and reducing radius respectively.
15. A system according to claim 1, wherein
said two dimensional storage array is part of a three dimensional storage array.
16. A system according to claim 1, wherein
said two dimensional storage array comprises a three dimensional storage array.
17. A method for ordering acquisition of frequency domain components representing MR image data for storage in an array performed using a storage array, a magnetic field generator and a processor, comprising the activities of:
generating a magnetic field for use in acquiring a plurality of individual frequency components corresponding to individual data elements in a two dimensional storage array, said array of individual data elements having a designated center and individual data elements individually having a radius to said designated center, said individual frequency components being successively acquired in an order in which radius of respective corresponding individual data elements increases and decreases as said plurality of individual frequency components is sequentially acquired during acquisition of an MR dataset representing an MR image;
ordered acquiring of individual frequency components using said magnetic field; and
ordered storing of acquired individual frequency components representing an MR dataset in the corresponding individual data elements.
18. A method according to claim 17, wherein
said storage array comprises a portion of a three dimensional array.

* * * * *